US011307506B2

(12) United States Patent
Wang

(10) Patent No.: US 11,307,506 B2
(45) Date of Patent: Apr. 19, 2022

(54) METHOD, APPARATUS, AND SYSTEM FOR FORMING CODE

(71) Applicant: WUHAN CHINA STAR OPTOELECTRONICS TECHNOLOGY CO., LTD., Hubei (CN)

(72) Inventor: Wei Wang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 323 days.

(21) Appl. No.: 16/492,492

(22) PCT Filed: Apr. 1, 2019

(86) PCT No.: PCT/CN2019/080810
§ 371 (c)(1),
(2) Date: Sep. 9, 2019

(87) PCT Pub. No.: WO2020/124860
PCT Pub. Date: Jun. 25, 2020

(65) Prior Publication Data
US 2021/0325790 A1    Oct. 21, 2021

(30) Foreign Application Priority Data

Dec. 21, 2018 (CN) .......................... 201811568188.4

(51) Int. Cl.
*G03F 9/00* (2006.01)
*G03F 7/20* (2006.01)

(52) U.S. Cl.
CPC ........ *G03F 9/7015* (2013.01); *G03F 7/70683* (2013.01); *H01L 2223/54433* (2013.01)

(58) Field of Classification Search
CPC ...................... H01L 2223/54433; G03F 9/7015
See application file for complete search history.

(56) References Cited

U.S. PATENT DOCUMENTS

| 9,601,436 B2* | 3/2017 | Lai | ........................ H01L 23/544 |
| 2005/0047543 A1* | 3/2005 | Sandstrom | .......... G03F 7/70466 378/34 |

FOREIGN PATENT DOCUMENTS

| CN | 103092005 A | 5/2013 |
| CN | 103935138 A | 7/2014 |
| JP | 2003217462 A | 7/2003 |

* cited by examiner

*Primary Examiner* — Steven Whitesell Gordon
(74) *Attorney, Agent, or Firm* — Benesch, Friedlander, Coplan & Aronoff LLP

(57) ABSTRACT

The present application provides a method, an apparatus, and a system for forming code. The method includes while a substrate is transferred to an exposure machine, adjusting the substrate to align with an exposure alignment mark on the substrate with the exposure machine; forming a code formation area on the adjusted substrate by controlling the exposure machine; while the substrate formed with the code formation area is transferred to a code formation machine, adjusting the substrate to align the exposure alignment mark on the substrate with the code formation machine; and forming an identification code in the code formation area on the adjusted substrate by controlling the code formation machine.

13 Claims, 5 Drawing Sheets

METHOD, APPARATUS, AND SYSTEM FOR FORMING CODE

CROSS REFERENCE TO RELATED APPLICATION

This application claims the priority of International Application No. PCT/CN2019/080810, filed on 2019 Apr. 1, which claims priority to Chinese Application No. 201811568188.4 filed on 2018 Dec. 21. The entire disclosures of each of the above applications are incorporated herein by reference.

FIELD OF INVENTION

The present application relates to the field of display panel technologies, and more particularly to a method, an apparatus, and a system for forming code.

BACKGROUND

The disclosure hereafter merely provides background information related to the present application and do not necessarily constitute prior art.

In recent years, small and medium-sized thin-film transistor liquid crystal displays (TFT-LCDs) and organic light-emitting diodes (OLEDs) have been rapidly developed. For purposes of improving product yield and tracking defective products, each display panel is provided with a unique identification code, and a glass substrate for fabricating the same is also provided with a unique identification code, so that all glass substrates are required to perform identification. Therefore, a code formation machine is adopted during fabrication processes of the display panel, and code formation accuracy is decided by exposure accuracy and code formation accuracy on basis of using a precision optical exposure machine.

The identification code on the glass substrate is typically formed in a non-display area. As narrow frame display panels become a development trend, a distance from the center of a code formation frame to an edge of the glass substrate is gradually reduced, resulting in a space allowing deviation of the same identification code is reduced. The code formation machine may cause deviations during a code formation process, so that the identification code deviates from the code formation frame. Some identification codes may even form outside the code formation frame, and the code formation accuracy is poor, which may result in the identification code being unreadable, which is disadvantageous to product tracking and causes manufacturers to have massive economic losses.

In summary, the exemplary method for forming code has problems of low accuracy during forming code.

SUMMARY

In order to overcome the deficiencies of the prior art, the present invention provides methods, apparatuses, and systems for forming code. The low accuracy during forming code can be solved through making the alignment mark for aligning the code formation machine the same with the alignment mark of the exposure machine used during aligning. To solve the aforementioned problems, the present application provides the following technical solutions:

The present application provides a method for forming code, comprising:

in response to transferring of a substrate to an exposure machine, adjusting the substrate to align with an exposure alignment mark on the substrate with the exposure machine;

forming a code formation area on the adjusted substrate by controlling the exposure machine;

in response to transferring of the substrate formed with the code formation area to a code formation machine, adjusting the substrate to align the exposure alignment mark on the substrate with the code formation machine; and forming an identification code in the code formation area on the adjusted substrate by controlling the code formation machine.

In the method for forming the code provided by an embodiment of the present application, adjusting the substrate to align the exposure alignment mark on the substrate with the code formation machine comprises:

identifying the exposure alignment mark on the substrate by the code formation machine; and detecting whether the exposure alignment mark is aligned with the code formation machine at each time that the exposure alignment mark is identified;

upon a condition that the exposure alignment mark is not aligned with the code formation machine, adjusting the substrate according to the exposure alignment mark to align the exposure alignment mark on the substrate with the code formation machine.

In the method for forming the code provided by an embodiment of the present application, the code formation machine is provided with a standard alignment mark.

Detecting whether the exposure alignment mark is aligned with the code formation machine comprises:

obtaining a substrate image through the code formation machine, and the obtained substrate image comprises the exposure alignment mark and the standard alignment mark; and detecting whether the exposure alignment mark and the standard alignment mark on the substrate image are overlapped;

upon a condition that the exposure alignment mark and the standard alignment mark on the substrate image are overlapped, determining that the exposure alignment mark is aligned with the code formation machine;

upon a condition that the exposure alignment mark and the standard alignment mark on the substrate image are not overlapped, determining that the exposure alignment mark is not aligned with the code formation machine In the method for forming the code provided by an embodiment of the present application, adjusting the substrate according to the exposure alignment mark comprises:

obtaining positions of the exposure alignment mark and the standard alignment mark in the substrate image;

calculating a deviation value of positions of the exposure alignment mark and the standard alignment mark; and adjusting the substrate according to the deviation value.

In the method for forming the code provided by an embodiment of the present application, the substrate is fixed on a tool by a chuck.

Adjusting the substrate according to the deviation value comprises controlling rotation or movement of the chuck on the machine according to the deviation value to drive the substrate to rotate or move.

In the method for forming the code provided by an embodiment of the present application, forming the identification code in the code formation area on the adjusted substrate by controlling the code formation machine, comprises:

obtaining the position of the code formation area according to the position of the exposure alignment mark on the adjusted substrate; and controlling the code formation machine to form the identification code in the code formation area according to the position of the code formation area.

In the method for forming the code provided by an embodiment of the present application, the code formation machine comprises a plurality of alignment lenses of fixed positions, and each of the alignment lenses is formed with a standard alignment mark. The substrate is formed with a plurality of exposure alignment marks, and the plurality of exposure alignment marks are respectively aligned with the plurality of alignment mark.

Adjusting the substrate to align the exposure alignment marks on the substrate with the code formation machine comprises:

adjusting the substrate to align each of the exposure alignment marks with the corresponding standard alignment marks.

In the method for forming the code provided by an embodiment of the present application, the code formation machine comprises a code formation lens, and the code formation area comprises a plurality of sub-areas.

Forming the identification code in the code formation area on the adjusted substrate by controlling the code formation machine comprises:

forming the identification code in each of the sub-areas by controlling the code formation lens.

The present application further provides an apparatus for forming code, comprising:

a first regulator configured to adjust a substrate while the substrate being transferred to an exposure machine and align an exposure alignment mark on the substrate with the exposure machine;

a first controller configured to control the exposure machine to form a code formation area on the adjusted substrate;

a second regulator configured to adjust the substrate while the substrate formed with the code formation area being transferred to the code formation machine to align the exposure alignment mark on the substrate with the code formation machine; and a second controller configured to control the code formation machine to form an identification code on the code formation area of the adjusted substrate.

The present application further provides a system for forming code, comprising a tool, a control system, an exposure machine and a code formation machine:

the tool is configured to transfer a substrate;

the exposure machine is configured to form a code formation area on the substrate;

the code formation machine is configured to form an identification code in the code formation area; and the control system, comprising an apparatus for forming a code, and the code formation apparatus comprises:

a first regulator configured to adjust the substrate to align an exposure alignment mark on the substrate with the exposure machine while the substrate being transferred to an exposure machine;

a first controller configured to control the exposure machine to form the code formation area on the adjusted substrate;

a second regulator configured to adjust the substrate to align the exposure alignment mark with the code formation machine while the substrate formed with the code formation area being transferred to the code formation machine; and a second controller configured to control the code formation machine to form an identification code on the code formation area of the adjusted substrate.

In the system for forming the code provided by an embodiment of the present application, the tool is provided with a chuck, and the substrate is fixed on the tool by the chuck, so that the chuck rotates or moves on the tool to drive the substrate being rotated or moved.

In the system for forming the code provided by an embodiment of the present application, the code formation machine comprises a plurality of alignment lenses of fixed locations, and each of the alignment lenses is formed with a standard alignment mark. The substrate is formed with a plurality of exposure alignment marks, and the plurality of exposure alignment marks are respectively aligned with the plurality of standard alignment marks while the exposure alignment marks are aligned with the code formation machine.

In the system for forming the code provided by an embodiment of the present application, the code formation machine comprises a code formation lens, and a position of the code formation lens is changeable.

In the system for forming the code provided by an embodiment of the present application, a shape of the exposure alignment mark comprises a cross shape or an L shape.

In the system for forming the code provided by an embodiment of the present application, the identification code comprises a two-dimensional code or a barcode.

In the system for forming the code provided by an embodiment of the present application, the code formation area on the substrate is formed of photoresists.

The beneficial effects of the present application is that the position of the code formation area on the substrate is decided by aligning the exposure machine 2 and the exposure alignment mark on the substrate. Compared with the code formation machine makes sure the position of the code formation area through three-point scanning performed to edges of the substrate, the code formation machine and the exposure machine in the present application uses the same alignment mark to perform alignment to ensure the position of the code formation area. Alignment deviation between the code formation machine and the exposure machine are the same, so that the same coordinate system is used for alignment, and the alignment deviation between the exposure machine and the code formation machine is reduced to zero. Therefore, the position of the code formation area can be more accurately obtaining by the code formation machine to perform the code formation, thereby preventing the identification code from deviating the code formation area, and tremendously increasing the code formation accuracy.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
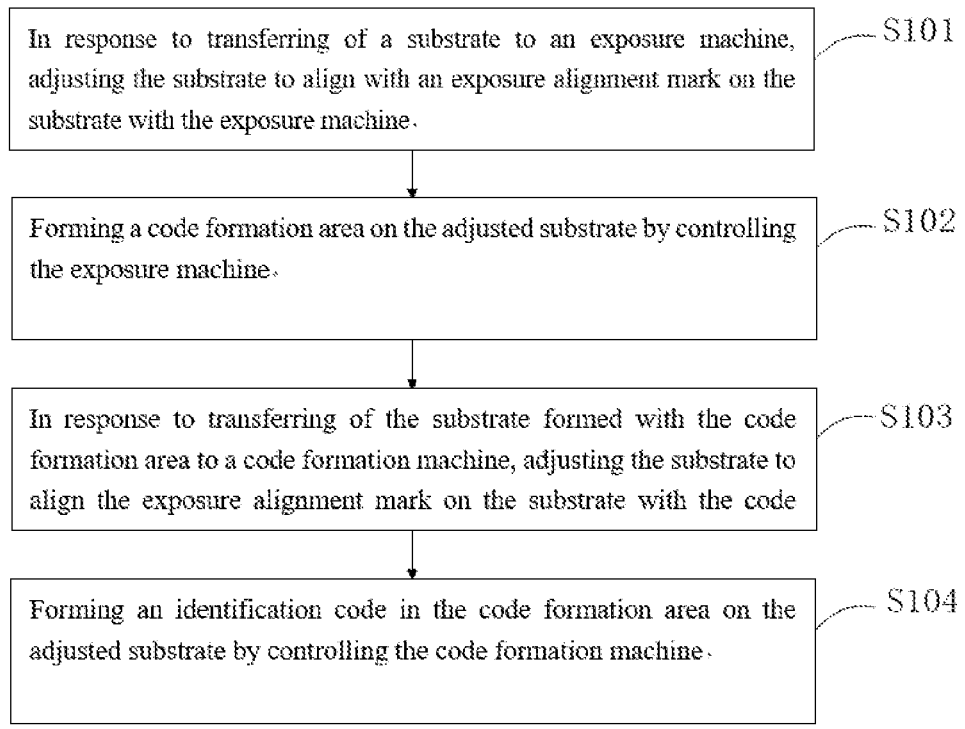
FIG. 1 is a schematic diagram of a flowchart of a method for forming code provided by the present application.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

In the description of the present application, it is to be understood that the terms such as "center" and "longitudinal", "up", "lower", "left", "right", "vertical", "horizontal", "top", "bottom", "inner", and "outer" are based on the orientation or position relation shown in the figure. In order to facilitate describing the present application and simplify the description, it is not to indicate or imply that the indicated device or element must have a specific orientation, and it is constructed and operated in a specific orientation and is therefore not to be construed as a limitation to the present application. In addition, the terms "first" and "second" are used only for purposes of description, and cannot be understood to indicate or imply a relative importance or to implicitly indicate the number of technical features indicated. Thus, a "first" is defined, the features of the "second" can be expressly or implicitly included in one or more of the features. In the description of the application, the meanings of "a plurality of" are two or more, unless specifically limited otherwise.

In the present application, unless expressly stated and defined otherwise, the terms "installed", "connected" and "connected", the terms of "fixation" and the like should be construed broadly, for example, the method can be fixedly connected, and can also be detachably connected or integrally connected; can be mechanically connected or electrically connected, and can be directly connected, and can also be indirectly connected through an intermediate medium, and can be communicated with the inside of the two elements. For a person of ordinary skill in the art, the specific meanings of the terms in the application can be understood according to specific situations.

The terms used herein is for the purpose of describing the particular embodiments, and is not intended to limit the exemplary embodiments. Unless the context clearly indicates otherwise, the singular forms "one", "one" are used herein is also intended to include plural. It is also to be understood that the terms "comprising" and/or "including", as used herein, are intended to mean the stated features, integers, steps, operations, units and/or components without excluding the presence or addition of one or more other features, integers, steps, operations, units, components, and/or combinations thereof.

Embodiments of the present invention will now be described in detail below and with reference to the drawings.

As shown in FIG. 1, an embodiment of the present application provides a method for forming code, comprising the following steps:

S101: in response to transferring of a substrate to an exposure machine, adjust the substrate to align with an exposure alignment mark on the substrate with the exposure machine.

Figure 2:
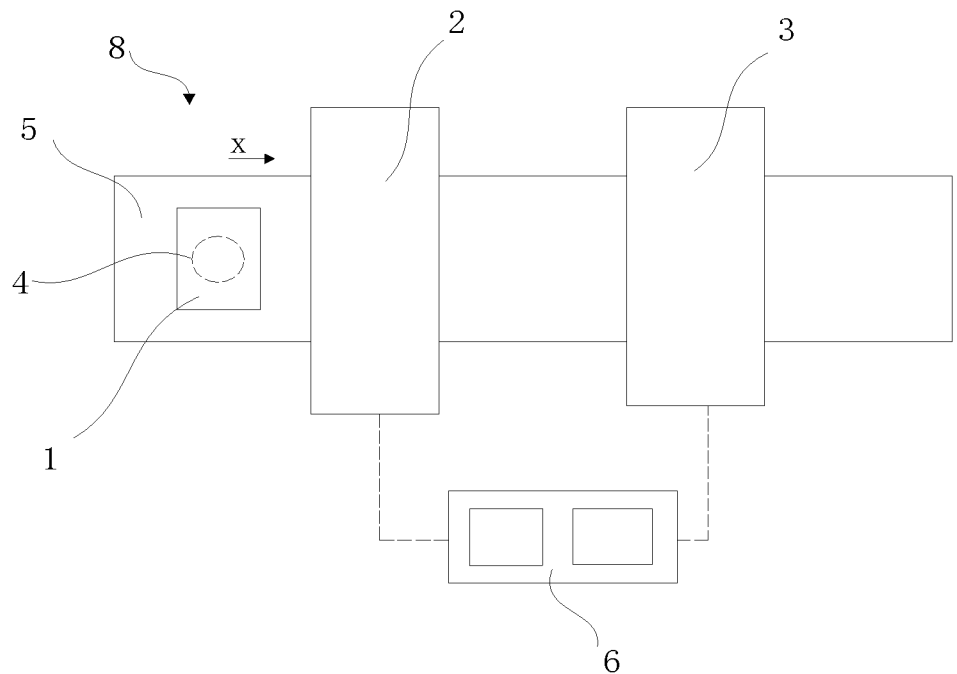
FIG. 2 is a schematic diagram of a structure of a system for forming code provided by the present application.
Figure 3:
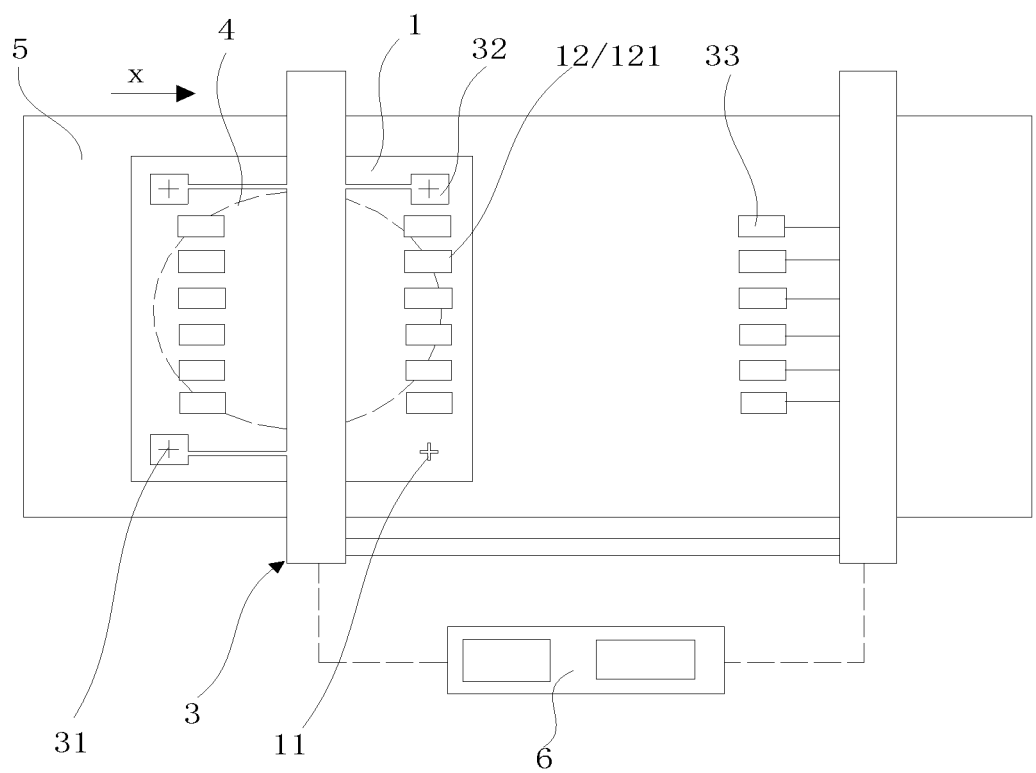
FIG. 3 is a schematic diagram of a structure of a code formation machine provided by the present application.

As shown in FIG. 2 and FIG. 3, while the substrate 1 is transferred along an X direction over a tool 5 and arrives at the exposure machine 2, the tool 5 stops and the substrate 1 is underneath the exposure machine 2. An exposure alignment mark 11 on the substrate 1 is aligned with the exposure machine 2 through controlling and adjusting a position of the substrate 1 by a control system 6.

S102: forming a code formation area on the adjusted substrate by controlling the exposure machine.

Figure 4:
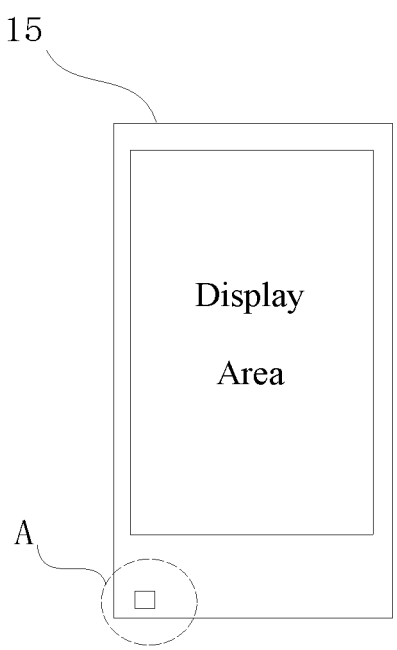
FIG. 4 is a schematic diagram of a position of a code formation area provided by the present application.

As shown in FIG. 3 and FIG. 4, the substrate 1 comprise a plurality of small substrates 15, and each of the small substrate 15 is needed to form code thereon. Therefore, the exposure machine 2 forms a plurality of code formation areas 12 on the substrate 1, and the code formation area 12 is disposed outside the display area of the small substrate 15, substantially on a periphery of the small substrate 15. A distance from the code formation area 12 to the small substrate 15 is small, so that the code formation accuracy of is highly requested.

S103: in response to transferring of the substrate formed with the code formation area to a code formation machine, adjust the substrate to align the exposure alignment mark on the substrate with the code formation machine.

Figure 6:
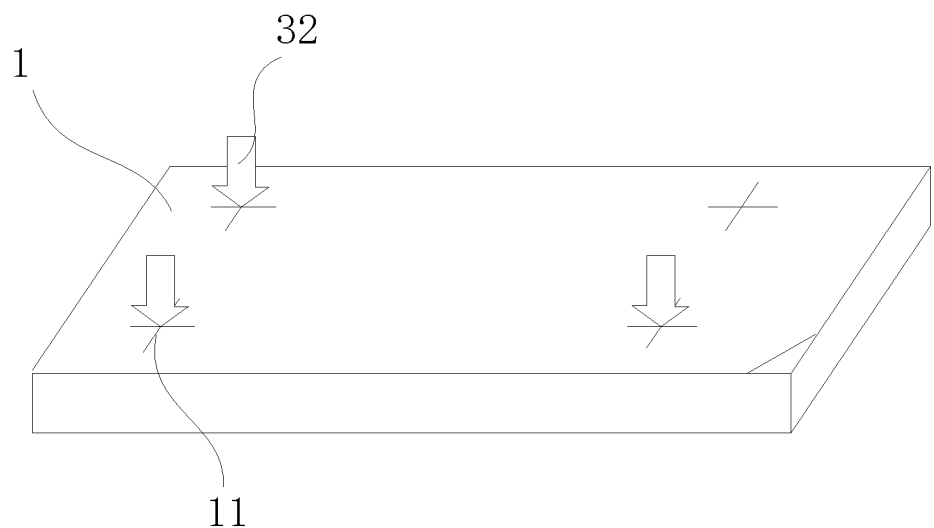
FIG. 6 is a schematic diagram of an alignment of a code formation lens and an exposure alignment mark provided by the present application.

As shown in FIG. 3 and FIG. 6, while the substrate 1 formed with the code formation area 12 is transferred to a code formation machine 3, a tool 4 stops and the exposure alignment mark 11 on the substrate 1 is aligned with the code formation machine 3 through controlling and adjusting the position of the substrate 1 by the control system 6.

In one embodiment, the substrate is adjusted to align the exposure alignment mark on the substrate with the code formation machine in S103 comprises the following steps:

identifying the exposure alignment mark 11 on the substrate 1 by the code formation machine 3; and detecting whether the exposure alignment mark 11 is aligned with the code formation machine 3 at each time that the exposure alignment mark 11 is identified;

upon a condition that the exposure alignment mark is not aligned with the code formation machine, adjusting the substrate 1 according to the exposure alignment mark 11 to align the exposure alignment mark 11 on the substrate 1 with the code formation machine 3.

In the present embodiment, the code formation machine 3 is disposed above the substrate 1, the code formation machine 3 performs identification to the exposure alignment mark 11 on the substrate 1 while the substrate 1 is transferred to a place underneath the code formation machine 3. Once the exposure alignment mark 11 is identified, examine whether the exposure alignment mark 11 is aligned with the code formation machine 3 or not. Once the exposure alignment mark 11 and the code formation machine 3 are aligned, a code formation process is next performed. Once the exposure alignment mark 11 and the code formation machine 3 are not aligned, the position of the substrate 1 will be adjusted, and the code formation machine 3 again identifies the exposure alignment mark 11 to check the exposure alignment mark 11 and the code formation machine 3 are aligned or not after adjusting the position of the substrate 1. Such identification, examination, and adjustment are repeatedly performed until the exposure alignment mark 11 on the substrate 1 is aligned with the code formation machine 3, and then the code formation process is proceeded.

Figure 8:
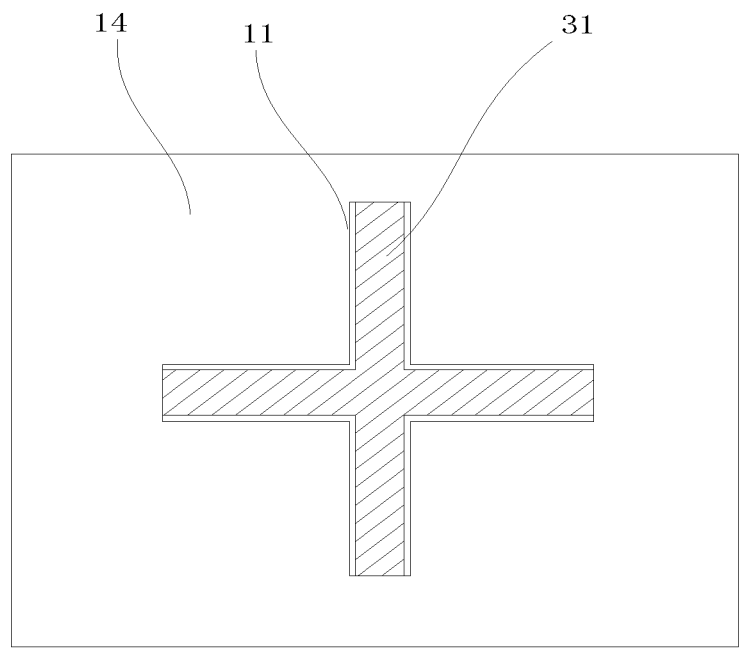
FIG. 8 is a schematic diagram of a substrate image provided by the present application.

In one embodiment, as shown in FIG. 3 and FIG. 8, the code formation machine 3 is provided with a standard alignment mark 31. Detecting whether the exposure alignment mark 11 is aligned with the code formation machine 3 comprises the following steps:

obtaining a substrate image 14 through the code formation machine 3, and the obtained substrate image 14 comprises the exposure alignment mark 11 and the standard alignment mark 31; and detecting whether the exposure alignment mark 11 and the standard alignment mark 31 in the substrate image are overlapped;

upon a condition that the exposure alignment mark and the standard alignment mark in the substrate image are overlapped, determining that the exposure alignment mark 11 is aligned with the code formation machine 3;

upon a condition that the exposure alignment mark and the standard alignment mark in the substrate image are not overlapped, determining that the exposure alignment mark 11 is not aligned with the code formation machine 3.

More specifically, the substrate image is an image of a partial area on the substrate 11.

In the present embodiment, the exposure alignment mark 11 and the standard alignment mark 31 are formed in the same substrate image 14, therefore whether the exposure alignment mark 11 and the standard alignment mark 31 are overlapped can be easily and accurately determined, thereby identifying whether the exposure alignment mark 11 is aligned with the code formation machine 3.

In one embodiment, adjusting the substrate 1 according to the exposure alignment mark 11 comprises the following steps:

obtaining positions of the exposure alignment mark 11 and the standard alignment mark 31 in the substrate image 14;

calculating a deviation value of positions of the exposure alignment mark 11 and the standard alignment mark 31; and adjusting the substrate 1 according to the deviation value.

In the present embodiment, specific positions of the exposure alignment mark 11 and the standard alignment mark 3 in the substrate image 14 can be calculated by the control system 6, and a deviation value of positions therebetween can be obtained. The position of the substrate 1 can be precisely adjusted according to the deviation value, thereby ensuring an alignment between the exposure alignment mark 11 and the code formation machine 3.

In one embodiment, as shown in FIG. 2 and FIG. 3, the substrate 1 is fixed on the tool 5 by a chuck 4. Adjusting the substrate according to the deviation value comprises controlling the chuck 4 to rotate or move on the tool 5 according to the deviation value to drive the substrate 1 to rotate or move.

In the present application, the deviation value between positions of the exposure alignment mark 11 and the standard alignment mark 31 in the substrate image 14 comprises position deviation values on a first direction (X-axis) and a second direction (Y-axis) and an angular deviation value therebetween, wherein the first direction (X-axis) is perpendicular to the second direction (Y-axis). A system controlling the code formation machine 3 uses the first direction (X-axis) and the second direction (Y-axis) as a coordinate system to perform calculation to positions of the exposure alignment mark 11 and the standard alignment mark 31. The above coordinate system is the same as a coordinate system during aligning of the exposure machine 2. The chuck 4 between the substrate 1 and the tool 5 is rotatable and removable along the first direction (X-axis) or the second direction (Y-axis). The substrate 1 is disposed above the chuck 4, and the substrate 1 is derived to rotate or move through rotation or movement of the chuck 4, thereby making the position deviation values respectively on the first direction (X-axis) and the second direction (Y-axis), and the angular deviation value therebetween in an allowable range to perform the alignment of the exposure alignment mark 11 and the code formation machine 3.

S104: forming an identification code on the code formation area of the adjusted substrate by controlling the code formation machine.

Figure 5:
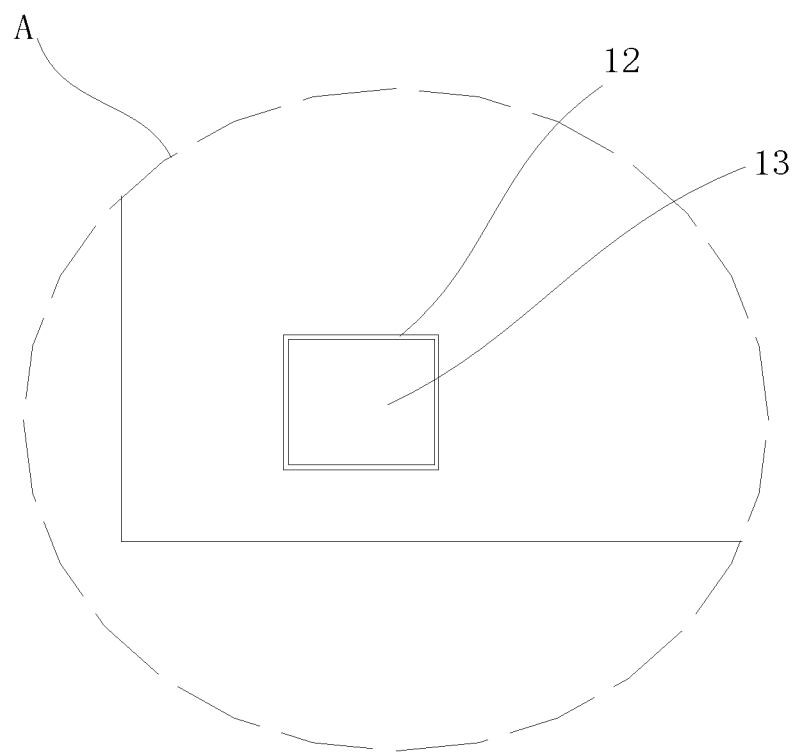
FIG. 5 is a schematic diagram of a structure of a portion A in FIG. 2.

As shown in FIG. 5 and FIG. 6, after adjusting the substrate 1, the code formation machine 3 is aligned with the exposure alignment mark 11, and an identification code 13 is formed in the code formation area 12 by the code formation machine 3.

In one embodiment, forming an identification code on the code formation area of the adjusted substrate by controlling the code formation machine, comprises the following steps:

obtaining the position of the code formation area 12 according to the position of the exposure alignment mark 11 on the adjusted substrate 1; and controlling the code formation machine 3 to form the identification code 13 in the code formation area 12 according to the position of the code formation area 12.

In the present embodiment, during formation of the code formation area 12 by the exposure machine 2, the substrate 1 is first covered with photoresists, and the photoresists on the substrate 1 is exposed and developed by a predetermined reticle, and the code formation area 12 made of photoresists is formed. A relation between positions of the code formation area 12 and the exposure alignment mark 11 is known, and a specific position of the code formation area 12 can be calculated according to the position of the exposure alignment mark 11 on the adjusted substrate 1. Therefore, the identification code 13 is formed by performing code formation in the known code formation area 12 through precisely control of the code formation machine 3.

Figure 7:
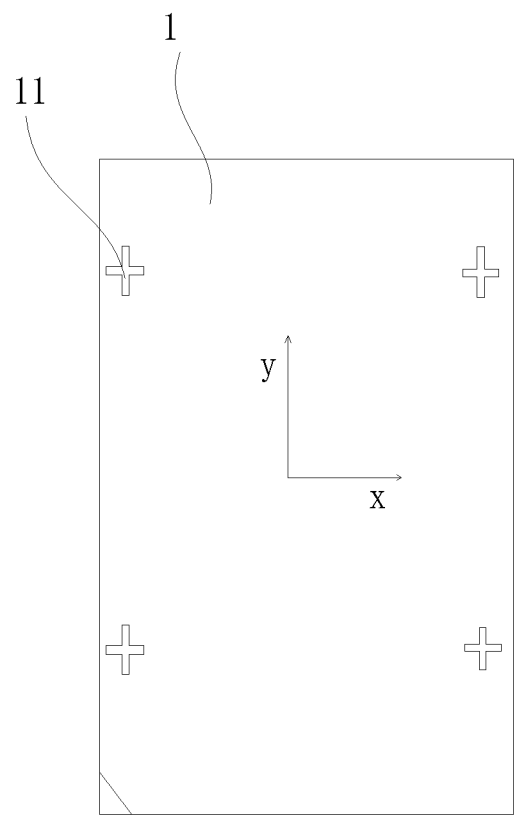
FIG. 7 is a schematic diagram of an exposure alignment mark on a substrate provided by the present application.

Specifically, the photoresists on the substrate 1 is exposed and developed by the exposure machine 2 to form the code formation area 12. The substrate 1 can be an array substrate, a color filter substrate, and other types of substrate as well. The exposure alignment mark is disposed on a black matrix layer of the substrate 1. As shown in FIG. 7, a shape of the exposure alignment mark comprises a cross shape or an L shape, and other shapes as well. The identification code 13 can be a two-dimensional code or a barcode.

In the present embodiment, the code formation area 12 is formed after aligning the exposure alignment mark 11 on the substrate 1 through the exposure machine 2, and the code formation machine 3 also aligns with the exposure alignment mark 11 before formation of the identification code 13. Deviation of the alignment between the exposure machine 2 and the code formation machine 3 is directly reduced and the alignment deviation between the exposure 2 and the code formation machine 3 is reduced to zero by using an aligning coordinate system the same with the exposure machine 2, thereby making the code formation machine 3 to perform code formation by more precisely aligning to the code formation area 12, thereby preventing the formed identification code 13 be deviated from the code formation area 12 and greatly increases the code formation accuracy.

In one embodiment, as shown in FIG. 3, the code formation machine 3 comprises a plurality of code formation lenses 32 (for example, three code formation lenses) of fixed positions, and a standard alignment mark 31 is disposed on each of the code formation lenses 32. The substrate 1 is provided with a plurality of exposure alignment marks 11, and the plurality of exposure alignment marks 11 align with the plurality of standard alignment marks 31, respectively.

In S103, adjusting the substrate to align the exposure alignment mark on the substrate with the code formation machine in S103 comprises:

adjusting the substrate 1 to align each of the exposure alignment marks with corresponding standard alignment marks.

Specifically, a number of the exposure alignment marks 11 is greater than or equal to a number of the code formation lenses 32.

In the present embodiment, the code formation machine 3 identifies the exposure alignment mark 11 and obtains the substrate image 14 comprising the exposure alignment mark 11 and the standard alignment mark 31 through the code formation lens 32. Positions of the code formation lenses 32 are fixed, and relations between the positions of the plurality of code formation lenses 32 (i.e., a relation between the positions of the plurality of standard alignment mark 31) correspond to a relation between the positions of the plurality of exposure alignment mark 11 on the corresponding substrate 1. That is, a corresponding relation exists while the standard alignment mark 31 on the code formation lens 33 matches the position of the exposure alignment mark 11 on the substrate 1.

In one embodiment, as shown in FIG. 3, the code formation machine 3 comprises a plurality of code formation lenses 33, and the code formation area 12 comprises a plurality of sub-areas 121.

Forming the identification code 13 in the code formation area 12 on the adjusted substrate 1 by controlling the code formation machine 3 comprises:

forming the identification code 13 in each of the sub-areas 121 by controlling the plurality of code formation lenses 33.

In the present embodiment, the substrate 1 comprises a plurality of small substrates 15. As shown in FIG. 3 and FIG. 4, each of the small substrate 15 is needed to be formed with code. Therefore, a code formation area 12 is formed on each of the small substrates 15, and the code formation area 12 is formed of a plurality of sub-areas 121. Although there are a plurality of code formation lenses 33 on the code formation machine 3, the number thereof is smaller than the number of the sub-areas 121. Therefore, the code formation lenses 33 are first moved to portions of the sub-areas 121 to form the identification code 13, and are then moved to other sub-areas 121 to form the identification code 13, thereby finally finish code formation of the all sub-areas 121.

Figure 9:
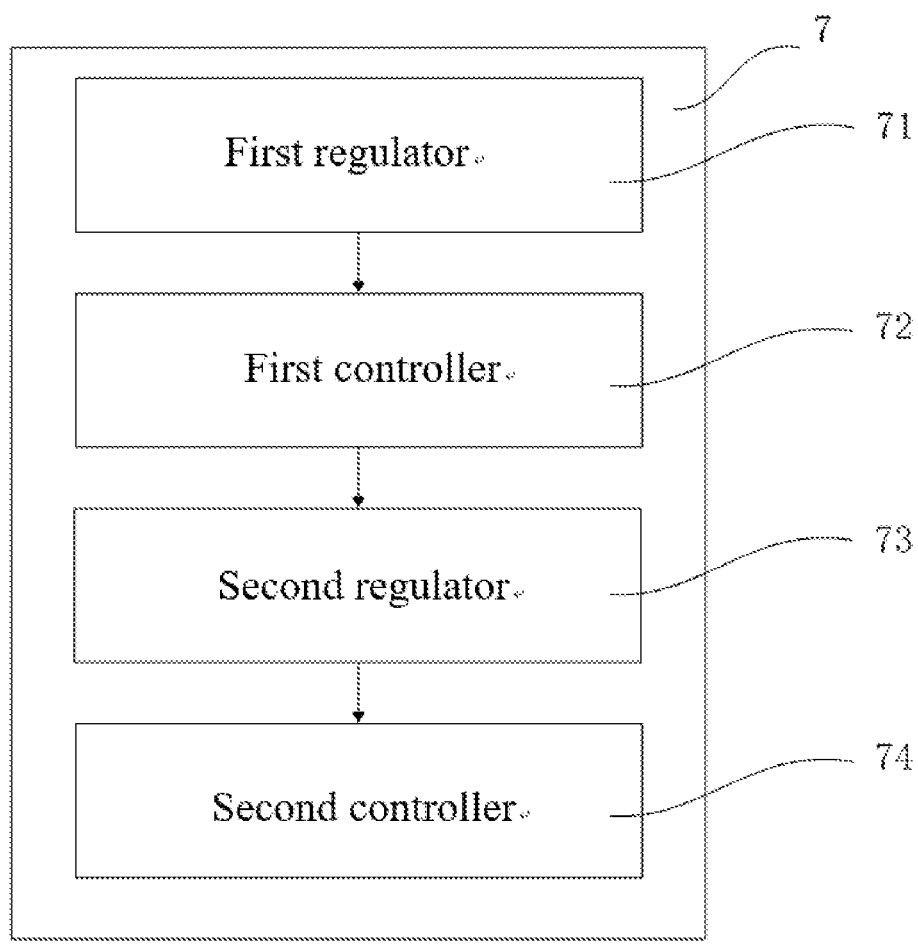
FIG. 9 is a schematic diagram of an apparatus for forming code provided by the present application.

As shown in FIG. 9, the present embodiment also provides an apparatus 7 for forming code capable of applying the method for forming code described in the above embodiment, and the apparatus 7 for forming code comprises:

A first regulator 71 configured to adjust a substrate 1 while the substrate 1 is transferred to an exposure machine 2 and align an exposure alignment mark 11 on the substrate 1 with the exposure machine 2; a first controller 72 configured to control the exposure machine 2 to form a code formation area 12 on the adjusted substrate; a second regulator 73 configured to adjust the substrate 1 while the substrate 1 formed with the code formation area 12 is transferred to the code formation machine 3 to align the exposure alignment mark 11 on the substrate 1 with the code formation machine 3; and a second controller 74 configured to control the code formation machine 3 to form an identification code 13 on the code formation area 12 of the adjusted substrate 1.

In the present embodiment, the first regulator 71 and the second regulator 72 of the apparatus 7 for forming code use the same alignment mark to align, thereby adjusting the position of the substrate 1, so that the position for forming the code formation area 12 by the exposure machine 2 and the position for forming the identification code 13 by the code formation machine 3 are at the same height, thereby improving the code formation accuracy.

As shown in FIG. 2 and FIG. 3, the present application also provides a system 8 for forming code, comprising a tool 5, a control system 6, an exposure machine 2, and a code formation machine 3. The tool 5 is configured to transfer a substrate 1; the control system 6 is signally connected with the tool 5, the control system 2 and the code formation machine 3. The control system 6 comprises the apparatus for forming code in the above embodiment, and is not described here again; the exposure machine 2 is configured to form a code formation area 12 on the substrate 1; and the code formation machine 3 is configured to form an identification code 13 in the code formation area 12.

Specifically, the operating process for the system 8 for forming code comprises:

The tool 5 transfers the substrate 1 having the exposure alignment mark 11 along a first direction;

while the substrate 1 is transferred to an exposure machine 2, adjusting the substrate 1 to align with an exposure alignment mark 11 on the substrate 1 with the exposure machine 2. Then a code formation area 12 is formed on a predetermined position of the adjusted substrate 1 by the exposure machine 2;

While the substrate 1 formed with the code formation area 12 is transferred to a code formation machine 3, the alignment lens 32 of the code formation machine 3 identifies and obtains the substrate image 14 having the exposure alignment mark 11, and the standard alignment mark 31 on the alignment lens 32 is also obtained at the same time. The control system 6 performs calculations to positions of the exposure alignment mark 11 and the standard alignment mark 31, thereby obtaining a position deviation value therebetween. The position of the chuck 4 on the tool 5 is adjusted by the deviation value therebetween, thereby altering positions of the chuck 4 on the substrate 1. After this adjustment, the substrate image 14 comprising the exposure alignment mark 11 and the standard alignment mark 31 is again obtained, and positions thereof are calculated and analyzed. Once the position deviation falls in an allowable range (overlapped), the substrate is not adjusted further, otherwise the substrate 1 is again adjusted until the exposure alignment mark 11 is aligned with the standard alignment mark 31.

The control system 6 obtains the position of the code formation area 12 through the position of the exposure alignment mark 11 on the adjusted substrate 11, and the code formation lenses 33 of the code formation machine 3 are moved to the corresponding position to preform code formation, thereby forming the identification code 13.

Formation of the identification code 13 at a predetermined position on the substrate 1 needs cooperation of the exposure machine 2 and the code formation machine 3. The code formation accuracy is decided by the accuracy for forming the code formation area 12 at a predetermined position by the exposure machine 2, and the accuracy for forming the identification code 13 on the code formation area 12 by the code formation machine 3. The position of the code formation area 12 on the substrate 1 is decided by aligning the exposure machine 2 and the exposure alignment mark 11 on the substrate 1. Compared with a comparative example in which the code formation machine 3 makes sure the position of the code formation area 12 through three-point scanning performed to edges of the substrate, i.e., the code formation machine 3 and the exposure machine 2 use different alignment marks or aligning coordinate system to align and finish code formation. In the present embodiment, the code formation machine 3 and the exposure machine 2 uses the same alignment mark (the exposure alignment mark 11) to perform alignment to ensure the position of the code formation area 12. Alignment deviation between the code formation machine 3 and the exposure machine 2 are the same, so that the same coordinate system is used for alignment, and the alignment deviation between the exposure machine 2 and the code formation machine 3 is reduced to zero. Therefore, the position of the code formation area 12 can be more accurately obtained by the control system 6. By controlling the code formation lenses 33 of the code formation machine 3 to precisely move to over the code formation area 12, and form the identification code 13 in the code formation area 12, thereby preventing the identification code 13 from deviating the code formation area 12, and tremendously increasing the code formation accuracy.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for forming code, comprising:
in response to transferring of a substrate to an exposure machine, adjusting the substrate to align with an exposure alignment mark on the substrate with the exposure machine;
forming a code formation area on the adjusted substrate by controlling the exposure machine;
in response to transferring of the substrate formed with the code formation area to a code formation machine, adjusting the substrate to align the exposure alignment mark on the substrate with the code formation machine; and
forming an identification code in the code formation area on the adjusted substrate by controlling the code formation machine,
wherein adjusting the substrate to align the exposure alignment mark on the substrate with the code formation machine comprises:
identifying the exposure alignment mark on the substrate by the code formation machine; and
detecting whether the exposure alignment mark is aligned with the code formation machine at each time that the exposure alignment mark is identified; and
upon a condition that the exposure alignment mark is not aligned with the code formation machine, adjusting the substrate according to the exposure alignment mark to align the exposure alignment mark on the substrate with the code formation machine;
wherein the code formation machine is provided with a standard alignment mark, and wherein detecting whether the exposure alignment mark is aligned with the code formation machine comprises:
obtaining a substrate image through the code formation machine, and the obtained substrate image comprises the exposure alignment mark and the standard alignment mark;
detecting whether the exposure alignment mark and the standard alignment mark in the substrate image are overlapped; and
upon a condition that the exposure alignment mark and the standard alignment mark in the substrate image are overlapped, determining that the exposure alignment mark is aligned with the code formation machine.

2. The method as claimed in claim 1 wherein adjusting the substrate according to the exposure alignment mark comprises:
obtaining positions of the exposure alignment mark and the standard alignment mark in the substrate image;
calculating a deviation value of positions of the exposure alignment mark and the standard alignment mark; and
adjusting the substrate according to the deviation value.

3. The method as claimed in claim 2, wherein the substrate is fixed on a tool by a chuck, and wherein adjusting the substrate according to the deviation value comprises controlling rotation or movement of the chuck on the tool according to the deviation value to drive the substrate to rotate or move.

4. The method as claimed in claim 2, wherein forming the identification code in the code formation area on the adjusted substrate by controlling the code formation machine, comprises:
obtaining the position of the code formation area according to the position of the exposure alignment mark on the adjusted substrate; and
controlling the code formation machine to form the identification code in the code formation area according to the position of the code formation area.

5. The method as claimed in claim 1, wherein the code formation machine comprises a plurality of alignment lenses of fixed positions, and each of the alignment lenses is formed with a standard alignment mark;
wherein the substrate is formed with a plurality of exposure alignment marks, and the plurality of exposure alignment marks are respectively aligned with the plurality of alignment mark; and
wherein adjusting the substrate to align the exposure alignment marks on the substrate with the code formation machine comprises adjusting the substrate to align each of the exposure alignment marks with the corresponding standard alignment marks.

6. The method as claimed in claim 1, wherein the code formation machine comprises a code formation lens;
wherein the code formation area comprises a plurality of sub-areas; and
wherein forming the identification code in the code formation area on the adjusted substrate by controlling the code formation machine comprises forming the identification code in each of the sub-areas by controlling the code formation lens.

7. An apparatus for forming code, comprising:
a first regulator configured to adjust a substrate while the substrate being transferred to an exposure machine and align an exposure alignment mark on the substrate with the exposure machine;
a first controller configured to control the exposure machine to form a code formation area on the adjusted substrate;
a second regulator configured to adjust the substrate while the substrate formed with the code formation area being transferred to a code formation machine to align the exposure alignment mark on the substrate with the code formation machine; and a second controller configured to control the code formation machine to form an identification code on the code formation area of the adjusted substrate, wherein the code formation machine comprises a plurality of alignment lenses of fixed locations, and each of the alignment lenses is formed with a standard alignment mark; wherein the substrate is formed with a plurality of exposure alignment marks, and the plurality of exposure alignment marks are respectively aligned with the plurality of standard alignment marks while the exposure alignment marks are aligned with the code formation machine.

8. A system for forming code, comprising a tool, a control system, an exposure machine and a code formation machine, wherein:

the tool is configured to transfer a substrate;

the exposure machine is configured to form a code formation area on the substrate;

the code formation machine is configured to form an identification code in the code formation area; and the control system, comprising an apparatus for forming code, and the code formation apparatus comprises:

a first regulator configured to adjust the substrate to align an exposure alignment mark on the substrate with the exposure machine while the substrate being transferred to an exposure machine;

a first controller configured to control the exposure machine to form the code formation area on the adjusted substrate;

a second regulator configured to adjust the substrate to align the exposure alignment mark with the code formation machine while the substrate formed with the code formation area being transferred to the code formation machine; and a second controller configured to control the code formation machine to form an identification code on the code formation area of the adjusted substrate, wherein the code formation machine comprises a plurality of alignment lenses of fixed locations, and each of the alignment lenses is formed with a standard alignment mark; wherein the substrate is formed with a plurality of exposure alignment marks, and the plurality of exposure alignment marks are respectively aligned with the plurality of standard alignment marks while the exposure alignment marks are aligned with the code formation machine.

9. The system as claimed in claim 8, wherein the tool is provided with a chuck, and the substrate is fixed on the tool by the chuck, and wherein the chuck rotates or moves on the tool to drive the substrate rotated or moved.

10. The system as claimed in claim 8, wherein the code formation machine comprises a code formation lens, and a position of the code formation lens is changeable.

11. The system as claimed in claim 8, wherein a shape of the exposure alignment mark comprises a cross shape or an L shape.

12. The system as claimed in claim 8, wherein the identification code comprises a two-dimensional code or a barcode.

13. The system as claimed in claim 8, wherein the code formation area on the substrate is formed of photoresists.

* * * * *